US009508566B2

(12) United States Patent
Andry et al.

(10) Patent No.: US 9,508,566 B2
(45) Date of Patent: Nov. 29, 2016

(54) WAFER LEVEL OVERMOLD FOR THREE DIMENSIONAL SURFACES

(71) Applicant: International Business Machines Corporation, Armonk, NY (US)

(72) Inventors: Paul S Andry, Yorktown Heights, NY (US); Bing Dang, Chappaqua, NY (US); Eric P Lewandowski, White Plains, NY (US); Jae-Woong Nah, Closter, NJ (US); Bucknell C Webb, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/460,671

(22) Filed: Aug. 15, 2014

(65) Prior Publication Data

US 2016/0049344 A1 Feb. 18, 2016

(51) Int. Cl.
| H01L 23/00 | (2006.01) |
| H01L 21/56 | (2006.01) |
| H01L 21/82 | (2006.01) |
| H01L 23/31 | (2006.01) |
| H01L 23/538 | (2006.01) |

(52) U.S. Cl.
CPC ............ *H01L 21/565* (2013.01); *H01L 21/56* (2013.01); *H01L 21/561* (2013.01); *H01L 21/82* (2013.01); *H01L 23/3121* (2013.01); *H01L 23/5387* (2013.01); *H01L 23/564* (2013.01)

(58) Field of Classification Search
CPC ............... H01L 21/54–21/58; H01L 23/3107; H01L 23/564; H01L 23/293
See application file for complete search history.

(56) References Cited

U.S. PATENT DOCUMENTS

| 4,432,937 A | 2/1984 | Kuwayama et al. |
| 4,460,543 A | 7/1984 | Glaeser |
| 4,994,333 A | 2/1991 | Jose et al. |
| 5,240,793 A | 8/1993 | Glaeser |
| 5,306,580 A | 4/1994 | Mansfield, Jr. et al. |
| 5,326,652 A | 7/1994 | Lake |

(Continued)

FOREIGN PATENT DOCUMENTS

| EP | 2235773 B1 | 10/2010 |
| GB | 2501801 A | 11/2013 |

(Continued)

OTHER PUBLICATIONS

Beeckman, J et al.; "Liquid-crystal photonic applications"; SPIEDigitalLibrary.org/oe; Optical Engineering; vol. 50(8); 081202; Aug. 2011; Copyright 2011 SPIE; <http://opticalengineering.spiedigitallibrary.org/on04/07/2014 Terms of Use: http://spiedl.org/terms>.

(Continued)

*Primary Examiner* — Laura Menz
*Assistant Examiner* — Candice Y Chan
(74) *Attorney, Agent, or Firm* — Edward J. Wixted, III (57) ABSTRACT

Embodiments of the invention include a method for shaping a flexible integrated circuit to a curvature and the resulting structure. A flexible circuit is provided. An epoxy resin and amine composition is deposited on the flexible integrated circuit. The deposited epoxy resin and amine composition is B-staged. The flexible integrated circuit is placed within a mold of a curvature. The B-staged epoxy resin and amine composition is cured subsequent to placing the flexible integrated circuit within the mold of the curvature.

18 Claims, 5 Drawing Sheets

(56) References Cited

U.S. PATENT DOCUMENTS

| | | |
|---|---|---|
| 5,339,024 A | 8/1994 | Kuo et al. |
| 5,376,480 A | 12/1994 | Shinoda et al. |
| 5,451,766 A | 9/1995 | Van Berkel |
| 5,558,957 A | 9/1996 | Datta et al. |
| 5,591,548 A | 1/1997 | Mao |
| 5,827,621 A | 10/1998 | Morishita et al. |
| 5,897,522 A | 4/1999 | Nitzan |
| 6,379,835 B1 | 4/2002 | Kucherovsky et al. |
| 6,420,071 B1 | 7/2002 | Lee et al. |
| 6,482,543 B1 | 11/2002 | Shelekhin et al. |
| 6,540,938 B1 | 4/2003 | Afzali-Arkadani et al. |
| 6,982,132 B1 | 1/2006 | Goldner et al. |
| 7,087,348 B2 | 8/2006 | Holman et al. |
| 7,320,845 B2 | 1/2008 | Zucker |
| 7,348,096 B2 | 3/2008 | Schubert et al. |
| 7,435,395 B2 | 10/2008 | Durkot et al. |
| 7,446,380 B2 | 11/2008 | Bojarczuk et al. |
| 7,491,464 B2 | 2/2009 | Merrill et al. |
| 7,531,271 B2 | 5/2009 | Boulton et al. |
| 7,776,468 B2 | 8/2010 | Richards et al. |
| 7,820,329 B2 | 10/2010 | Boulton et al. |
| 8,029,927 B2 | 10/2011 | Tucholski |
| 8,268,475 B2 | 9/2012 | Tucholski |
| 8,441,411 B2 | 5/2013 | Tucholski et al. |
| 8,534,831 B2 | 9/2013 | Tepedino, Jr. et al. |
| 8,586,244 B2 | 11/2013 | Fensore et al. |
| 8,608,310 B2 | 12/2013 | Otis et al. |
| 8,637,349 B2 | 1/2014 | Jenson et al. |
| 8,877,103 B2 | 11/2014 | Alvarez-Carrigan et al. |
| 8,906,088 B2 | 12/2014 | Pugh et al. |
| 2002/0105092 A1* | 8/2002 | Coyle ............... H01L 21/56 257/778 |
| 2002/0161404 A1 | 10/2002 | Schmidt |
| 2003/0099884 A1 | 5/2003 | Chiang et al. |
| 2003/0165744 A1 | 9/2003 | Schubert et al. |
| 2005/0048699 A1* | 3/2005 | Matsunami ........ H01L 21/565 438/127 |
| 2005/0079418 A1 | 4/2005 | Kelley et al. |
| 2005/0266158 A1 | 12/2005 | Pokorny et al. |
| 2008/0187824 A1 | 8/2008 | Tomantschger |
| 2009/0108440 A1* | 4/2009 | Meyer ............... H01L 21/561 257/723 |
| 2010/0068617 A1 | 3/2010 | Bedjaoui et al. |
| 2010/0285372 A1 | 11/2010 | Lee et al. |
| 2010/0310932 A1 | 12/2010 | Martin et al. |
| 2011/0048781 A1 | 3/2011 | Neudecker et al. |
| 2011/0097623 A1 | 4/2011 | Marinis, Jr. et al. |
| 2011/0100458 A1 | 5/2011 | Kang et al. |
| 2011/0162972 A1 | 7/2011 | Furuya et al. |
| 2011/0163812 A1 | 7/2011 | Bansal et al. |
| 2011/0311857 A1 | 12/2011 | Tucholski |
| 2012/0140167 A1 | 6/2012 | Blum |
| 2012/0236254 A1 | 9/2012 | Pugh et al. |
| 2013/0035760 A1 | 2/2013 | Portney |
| 2013/0108907 A1 | 5/2013 | Bhardwaj et al. |
| 2013/0122132 A1 | 5/2013 | Pugh et al. |
| 2013/0174978 A1 | 7/2013 | Pugh et al. |
| 2013/0203895 A1* | 8/2013 | Dershem ............ C08G 59/44 523/400 |
| 2013/0222759 A1 | 8/2013 | Pugh et al. |
| 2013/0230774 A1 | 9/2013 | Ortega et al. |
| 2013/0258277 A1 | 10/2013 | Pugh et al. |
| 2014/0000101 A1 | 1/2014 | Pugh et al. |
| 2014/0028969 A1 | 1/2014 | Pugh et al. |
| 2014/0085599 A1 | 3/2014 | Etzkorn |
| 2014/0107445 A1 | 4/2014 | Liu |
| 2014/0320800 A1 | 10/2014 | Collins et al. |
| 2014/0340631 A1 | 11/2014 | Pugh |
| 2014/0346695 A1 | 11/2014 | Pugh et al. |
| 2014/0349211 A1 | 11/2014 | Wei et al. |
| 2014/0354946 A1 | 12/2014 | Pugh et al. |
| 2015/0323811 A1 | 11/2015 | Flitsch et al. |

FOREIGN PATENT DOCUMENTS

| | | |
|---|---|---|
| JP | 2006274346 A | 10/2006 |
| WO | 2008091859 A1 | 7/2008 |
| WO | 2011113903 A1 | 9/2011 |
| WO | 2013062662 A1 | 5/2013 |

OTHER PUBLICATIONS

Blue Spark Technologies, "UT Series Printed Batteries", Product Information, UT Series Oct-12-2, Copyright 2012, website: <www.bluesparktechnologies.com>.

Ding, Ke-Qiang; "Cyclic Voltmmetrically-prepared MnO2 Coated on a ITO Glass Substrate"; Journal of the Chinese Chemical Society; 2009; 56; pp. 171-181.

Li, Xiaoping et al. ; "Composite of Indium and Polysorbate 20 as Inhibitor for Zinc Corrosion in Alkaline Solution"; Bull. Korean Chem. Soc.; 2012; vol. 33; No. 5.; <http://dx.doi.org/10.5012/bkcs.2012.33.5.1566>.

Ren, Hongwen et al.; "Tunable electronic lens using a gradient polymer network liquid crystal" Received Oct. 15, 2002; accepted Nov. 12, 2002' Applied Physics Letters; vol. 82; No. 1; Jan. 6, 2003.

U.S. Appl. No. 61/858,346, filed Jul. 25, 2013 entitled "Variable Focal Length Lens".

U.S. Appl. No. 61/976,595, filed Apr. 8, 2014 entitled "Thin Flexible Microsystem with Low-Profile Integrated Thin Film Battery".

U.S. Appl. No. 14/340,304, filed Jul. 24, 2014 entitled Cathode for Thin File Microbattery.

U.S. Appl. No. 14/340,343, filed Jul. 24, 2014 entitled Homogeneous Solid Metallic Anode for Thin Film Microbattery.

U.S. Appl. No. 14/340,253, filed Jul. 24, 2014 entitled Thin, Flexible Microsystem With Integrated Energy Source.

U.S. Appl. No. 14/340,164, filed Jul. 24, 2014 entitled Variable Focal Length Lens.

Badugu et al.; "A Glucose Sensing Contact Lens: A Non-Invasive Technique for Continuous Physiological Glucose Monitoring"; Journal of Fluorescence; vol. 13; No. 5; Sep. 2003; Copyright 2003; pp. 371-374.

Liao et al..; "A 3pW Wirelessly Powered CMOS Glucose Sensor for an Active Contact Lens"; 2011 IEEE International Solid-State Circuits Conference; 978-1-61284-302-5/11; copyright 2011 IEEE; pp. 38-41.

Rolka et al..; "Integration of a Capacitive EIS Sensor into a FIA System for pH and Penicillin Determination"; Sensors; ISSN 1424-8220; Copyright 2004 by MDPI; Sensors 2004, 4; pp. 84-94, website: <http://www.mdpi.net/sensors>.

U.S. Appl. No. 14/460,637, filed Aug. 15, 2014 entitled "Metal-Oxide-Semiconductor Capacitor Based Sensor".

Appendix P List of IBM Patents or Patent Applications Treated as Related.

* cited by examiner

WAFER LEVEL OVERMOLD FOR THREE DIMENSIONAL SURFACES

FIELD OF THE INVENTION

The present invention relates generally to the field of integrated circuit fabrication, and more particularly to a wafer level overmold for three dimensional surfaces.

BACKGROUND OF THE INVENTION

An integrated circuit is a set of electronic circuits on one small plate ("chip") of semiconductor material. System on a chip (SOC) is an integrated circuit that integrates all components of a computer or other electronic system into a single chip. Multi-chip module (MCM) is a specialized electronic package where multiple integrated circuits, semiconductor dies or other discrete components are packaged onto a unifying substrate, facilitating their use as a single component (as though a larger integrated circuit). System in package (SIP) is a number of integrated circuits enclosed in a single module (package). The SIP can perform all or most of the functions of an electronic system. System-on-Package (SOP) is a microelectronic technology that places an entire system on a single chip-size package. SOP saves interconnection time and heat generation by keeping a full system with computing, communications, and/or consumer functions all in a single chip.

Flexible electronics is a technology for assembling electronic circuits by mounting electronic devices on flexible plastic substrates, such as polymide, polyether ether ketone (PEEK), or transparent conductive polyester film. Flexible electronic assemblies may be manufactured using components used for rigid printed circuit boards, allowing the board to conform to a desired shape, or to flex during use.

SUMMARY

Embodiments of the invention include a method for shaping a flexible integrated circuit to a curvature and the resulting structure. The method may include providing a flexible circuit. The method may also include depositing an epoxy resin and amine composition on the flexible integrated circuit. The method may also include B-staging the deposited epoxy resin and amine composition. The method may also include placing the flexible integrated circuit within a mold of a curvature. The method may also include curing the B-staged epoxy resin and amine composition subsequent to placing the flexible integrated circuit within the mold of the curvature.

DETAILED DESCRIPTION

Embodiments of the present invention recognize that bonding a flexible integrated circuit to a curved surface is a difficult process because the integrated circuit is flexible and hard to work with. Embodiments of the present invention recognize that bonding a rigid structure integrated circuit, pre-shaped to a desired curvature, to a curved surface may be easier to work with than a flexible integrated circuit. Embodiments of the present invention describe structures and methods for creating a rigid integrated circuit curved to a desired curvature.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment," "an embodiment," "an example embodiment," etc., indicate that the embodiment described may include a particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the disclosed structures and methods, as oriented in the drawing Figures. The terms "overlaying," "atop," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

The present invention will now be described in detail with reference to the Figures.

Figure 1:
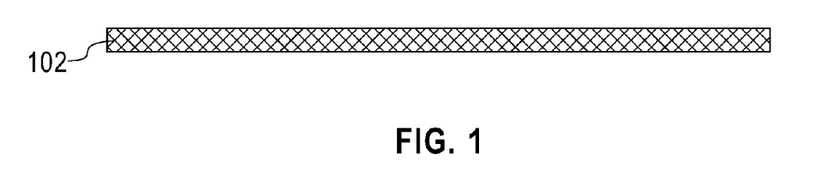
FIG. 1 depicts a temporary carrier upon which embodiments of the invention may be temporarily fabricated, in accordance with an embodiment of the present invention.

FIG. 1 depicts a temporary carrier upon which embodiments of the invention may be temporarily fabricated. Temporary carrier 102 may be composed of, for example, glass, wafer, metal, ceramic, or another material. In general, temporary carrier 102 may be any rigid material capable of temporarily bonding to a substrate or interposer, such as substrate 104 (see FIG. 2), via an adhesive.

Figure 2:
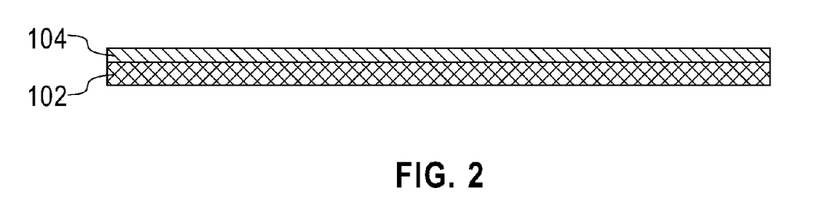
FIG. 2 depicts a process of temporarily bonding a substrate to a temporary carrier, in accordance with an embodiment of the present invention.

FIG. 2 depicts fabrication steps, in accordance with an embodiment of the present invention. FIG. 2 shows the portion of temporary carrier 102 shown in FIG. 1 with substrate 104 bonded to temporary carrier 102. Substrate 104 is composed of, for example, polymide (PI), polyester (PET), polyethylene napthalate (PEN), Polyethermide (PEI), polyether ether ketone (PEEK), transparent conductive polyester film, or another flexible plastic substrate material.

In embodiments of the present invention, substrate 104 is bonded to temporary carrier 102 via a temporary adhesive. The temporary adhesive may be, for example, an ultraviolet (UV) curable adhesive with an acrylic base resin, or a non-photodefinable polymide precursor designed for use as a temporary adhesive. For example, the temporary adhesive may be HD-3007, as produced by HD MicroSystems™, or a temporary adhesive produced by 3M™, such as 3M™ UV-Curable Adhesive LC-3200, 3M™ UV-Curable Adhesive LC-4200, 3M™ UV-Curable Adhesive LC-5200, or another type of temporary adhesive. In general, any adhesive may be used, provided that the adhesive provides a rigid, uniform support surface that minimizes stress on substrate 104 during subsequent processing steps, resulting in minimal warpage, cracking, and edge chipping. The temporary adhesive may release substrate 104 via a laser (e.g., at higher temperatures) or UV (e.g., at lower temperatures) debonding process.

In some embodiments, substrate 104 is modified based on the desired application of the resulting package. For example, solder bumps, wiring layers, wire bonding pads, metal foil, dielectrics, and/or bondwires may be affixed to substrate 104 to be used as the conductive element. In some embodiments, active components may be added, such as transistors and tunnel diodes. In some embodiments, passive components may be added, such as resistors, capacitors, inductors, and transformers.

Figure 3:
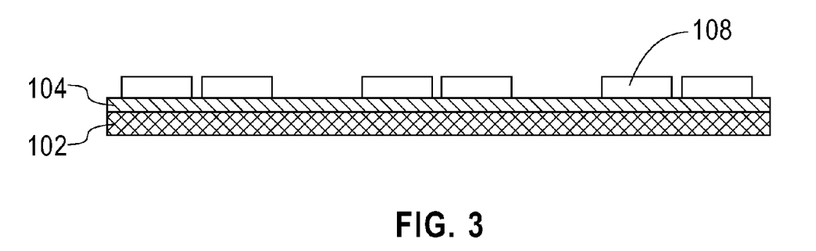
FIG. 3 depicts a process of bonding die to a substrate, in accordance with an embodiment of the present invention.

FIG. 3 depicts additional fabrication steps, in accordance with an embodiment of the present invention. FIG. 3 shows the portion of temporary carrier 102 with substrate 104 bonded to temporary carrier 102, as depicted in FIG. 2, and further includes die 108 bonded to substrate 104. Die 108 may each be, for example, flexible thin silicon chips, polymer chips, chip stacks, or other die types. Die 108 may each be identical, or different, depending upon the desired package application. Die 108 may each be bonded to substrate 104 via die bonding techniques, such as eutectic bonding, epoxy bonding, solder attach, or other methods. Subsequent to bonding die 108, the resulting structure may be a flexible integrated circuit affixed to temporary carrier 102. The flexible integrated circuit may be, for example, a system on a chip (SOC), multi-chip module (MCM) system in package (SIP), System-on-Package (SOP), or any other type of integrated circuit, providing the resulting structure has the required flexibility for the desired application.

Figure 4:
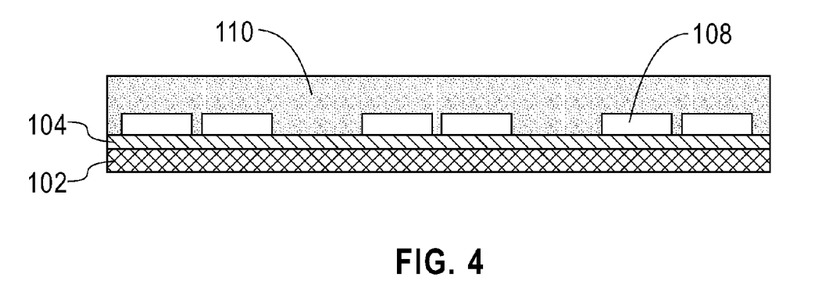
FIG. 4 depicts a process of over molding with a mold material, in accordance with an embodiment of the present invention.

FIG. 4 depicts additional fabrication steps, in accordance with an embodiment of the present invention. FIG. 4 depicts a process of over molding with mold material 110. Mold material 110 may be deposited or otherwise applied at least along the axis corresponding to the desired curvature (see FIGS. 10-12) for the integrated circuit application. Mold material 110 may be an epoxy and amine composition. In general, mold material 110 is composed of an epoxy and curing agent capable of being B-staged. B-staging is a process that utilizes heat to remove the majority of solvent from an adhesive, such as mold material 110. B-staging may also use heat and/or ultraviolet (UV) light to activate a curing agent and partially cure an adhesive. Once B-staged, in between adhesive application, assembly, and curing, the product can be held for a period of time, without sacrificing performance. In some embodiments, such as when mold material 110 is a liquid-type material, the over mold coating is applied via application processes such as spray coating, spin coating, squeezing, or other application processes.

Depending upon the integrated circuit application and the curvature desired, mold material 110 may be selected in order to provide the desired level of rigidity or flexibility. In some embodiments, a high molecular weight epoxy with a high temperature curing agent and solvent may be used. In such an embodiment, evaporation of the solvent leads to a B-staged resin (see FIG. 5) which is less tacky than the fully uncured resin. In some embodiments, the epoxy resin weight percentage is between 10 and 30 percent of the total mixture of mold material 110. Common epoxy resins that may be used in mold material 110 include DGEBF (CAS 9003-36-5) BisPhenol F diglycidylether and DGEBA (CAS 25068-38-6) BisPhenol A diglycidylether. Other epoxies, such as glycidyl ether of 2-methyl aminophenol, may be used in the composition that comprises mold material 110. In some embodiments, the type of curing agent used may depend on the desired curing temperature, flexibility, or other properties. In some embodiments, the weight percentage of the curing agent is between 5 and 20 percent of the total mixture of mold material 110. In some embodiments, an aromatic primary amine may be used as a hardener for the epoxy resin. Example aromatic amines include diethyltoluenediamine and meta phenylene diamine. In such an embodiment, curing of the epoxy resin may be halted after all primary amine reacts. In some embodiments, an epoxy and amine adduct, with a shortage of amine, may be created. In such an embodiment, additional amine and solvent may be added. In embodiments of the present invention, after evaporation of the solvent, the adduct will act like a thermoplastic, wherein the adduct will become pliable or moldable at a specific temperature range and return to a more solid state upon additional heating or cooling.

In some embodiments, a poly aliphatic amine may be used to create a high molecular weight amine adduct. Example poly aliphatic amines include diethylenetriamine, triethylenetetramine, and triethylenepentamine.

In embodiments of the present invention, the type of solvent used in the epoxy depends upon the preferred B-stage temperature for the specific semiconductor package. For example, a solvent may be desired that will result in the evaporation of most of the solvent at the B-stage temperature of mold material 110. Example solvents that may be selected for inclusion within mold material 110 may include, but are not limited to, acetone (evaporates at about 56° C.), methyl ethyl ketone (MEK) (evaporates at about 80° C.), cyclopentanone (evaporates at about 131° C.), and propylene glycol monomethyl ether acetate (PGMEA) (evaporates at about 146° C.).

In some embodiments, inorganic fillers and/or toughners may be added to mold material 110, depending on the desired elastic modulus and the desired coefficient of thermal expansion (CTE). Elastic modulus refers to a substance's tendency to be deformed elastically (i.e., non-permanently) when a force is applied to it. CTE describes how the size of an object changes with a change in temperature. Specifically, it measures the fractional change in size per degree change in temperature at a constant pressure. Fillers may include, for example, silicon dioxide (silica), aluminum oxide (alumina), and boron nitride. Silica may be used to lower CTE, increase elastic modulus, and is non-thermally conductive. Alumina may be used to lower CTE, increase elastic modulus, and is more thermally conductive than silica. Boron nitride may be used to lower CTE, increase modulus, and is more thermally conductive than silica. In some embodiments, fillers are added to the compound in the range of 0 to 75 percentage by weight (wt %). In embodiments for a more rigid application, mold material 110 may include fillers from 50 to 75 wt %. For a more flexible type of application, one would use a high molecular weight epoxy and very little inorganic filler. In some embodiments, other types of particles, such as fibers and rubber particles, may be added to increase toughness. In embodiments that include toughners, toughners will typically comprise one to three percentage by weight of mold material 110. In some embodiments, coupling agents are added to mold material 110 to improve bonding properties and filler resin coupling. Coupling agents may be, for example, an amine or epoxy silane compound. In embodiments that include coupling agents, the coupling agents will typically comprise less than one percent by weight of mold material 110. The particular couple agent used may depend on the filler and surfaces for bonding in the particular application. In some embodiments, a silane amine, silane epoxy, or silane anhydride is used to bond to an oxide surface.

In some embodiments, a dye or other material may be added to mold material 110. For example, carbon black may be added to provide additional structural benefit, as well as to enhance the aesthetic appearance of mold material 110.

Figure 5:
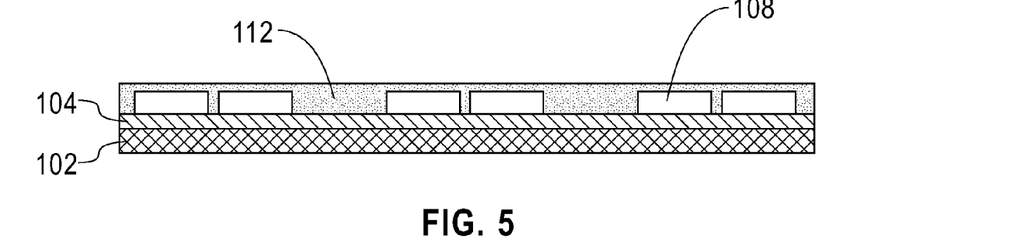
FIG. 5 depicts a process of B-staging mold material, in accordance with an embodiment of the present invention.

FIG. 5 depicts additional fabrication steps, in accordance with an embodiment of the present invention. In FIG. 5, mold material 110 has been B-staged and cured such that it is B-staged mold material 112. B-staging is a process that utilizes heat or UV light to remove the majority of solvent from an adhesive. In between adhesive application, assembly and curing, the product can be held for a period of time without sacrificing performance. B-staged mold material 112 will be less tacky than mold material 110, and is capable of being handled with a lower risk of damaging or otherwise negatively impacting the integrated circuit device(s).

Figure 6:
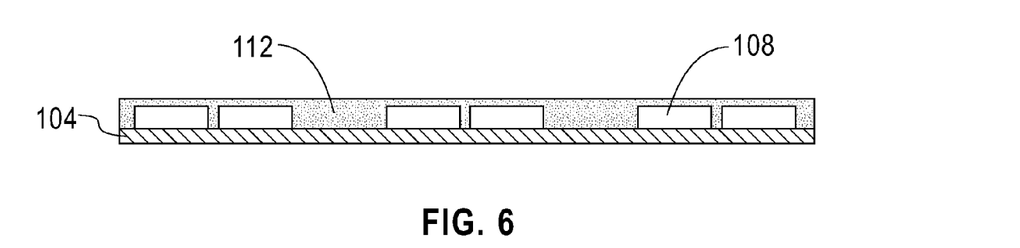
FIG. 6 depicts a process of detaching the resulting structure from a temporary carrier, in accordance with an embodiment of the present invention.

FIG. 6 depicts additional fabrication steps, in accordance with an embodiment of the present invention. In FIG. 6, the integrated circuit device(s) are released or detached from temporary carrier 102. In some embodiments, a laser is used to debond temporary carrier 102 from the integrated circuit device(s). In other embodiments, UV light may be used to debond temporary carrier 102 from the integrated circuit device(s). In some embodiments, the adhesive is peeled from the integrated circuit device(s) subsequent to the laser or UV light debonding process.

In one particular example, if the temporary adhesive used is HD-3007, as produced by HD MicroSystems™, the integrated circuit device(s) may be released or detached via a laser-release, solvent-release, or thermal-release technique. A laser release may be accomplished by irradiation through a glass carrier, such as an embodiment of temporary carrier 102, with a laser. A single laser pulse may be sufficient to cause debonding. A solvent release may be accomplished through the use of a perforated carrier wafer, such as a perforated glass carrier. A thermal release may be accomplished at temperatures comparable to bonding temperature of HD-3007.

Figure 7:
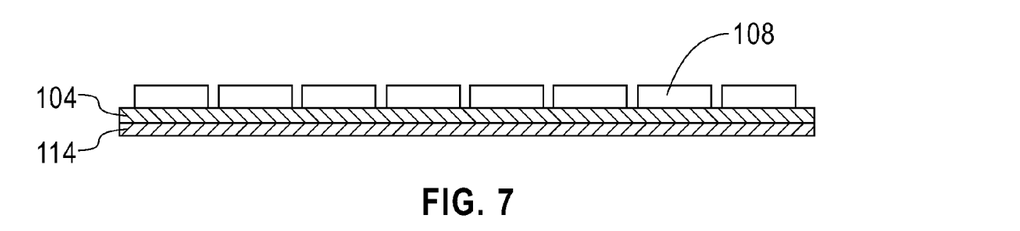
FIG. 7 depicts a process of applying molding film to a substrate side of a flexible integrated circuit, in accordance with an embodiment of the present invention.

FIG. 7 depicts the result of previously described fabrication steps, in accordance with an alternate embodiment of the present invention. In FIG. 7, die 108 may each be bonded to a temporary carrier (not shown), similar to temporary carrier 102, using a temporary adhesive. Such a temporary adhesive may be similar to temporary adhesives previously discussed. In some embodiments, substrate 104 may have previously been bonded to die 108, similar to the bonding steps discussed with regards to FIG. 3. In other embodiments, substrate 104 may be bonded to die 108 subsequent to bonding die 108 to the temporary carrier (not shown). Molding film 114 may be of similar epoxy and amine compositions, as discussed with regards to molding material 110 in FIG. 4, however, molding film 114 is film-type material that has been previously B-staged and may be directly applied to substrate 104, as depicted. In some embodiments, molding film 114 is applied via lamination techniques. As depicted, the integrated circuit device(s) may be released or detached from the temporary carrier (not shown) via debonding techniques discussed with regard to FIG. 6.

Figure 8:
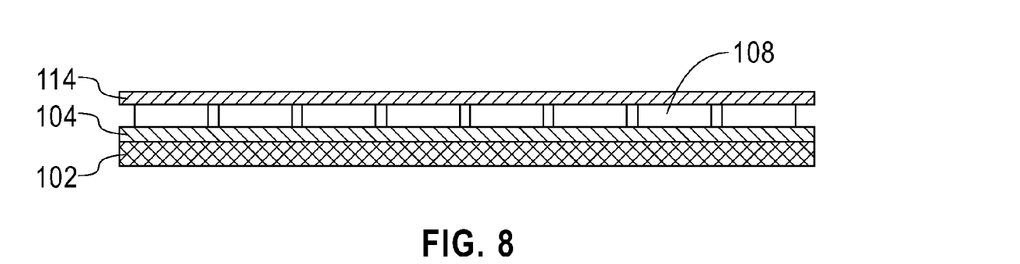
FIG. 8 depicts a process of applying molding film to a die side of a flexible integrated circuit, in accordance with an embodiment of the present invention.

FIG. 8 depicts yet another embodiment of the present invention. In FIG. 8, substrate 104 may be temporarily bonded to temporary carrier 102 according to the steps described in FIG. 2, and die 108 may be bonded to substrate 104 similarly to the steps described in FIG. 3. In the depicted embodiment, molding film 114 is applied to die 108. Molding film 114 may be applied to die 108 utilizing lamination or adhesive techniques discussed in FIG. 7.

Figure 9:
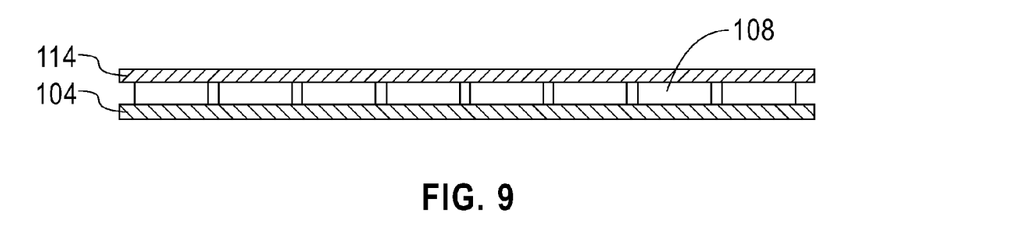
FIG. 9 depicts a process of detaching the resulting structure from a temporary carrier, in accordance with an embodiment of the present invention.

FIG. 9 depicts an embodiment of the present invention, as discussed with reference to FIG. 8. In FIG. 9, the integrated circuit device(s) are released or detached from temporary carrier 102. The integrated circuit device(s) may be released or detached from temporary carrier via steps similarly discussed with regard to FIG. 6.

Figure 10A:
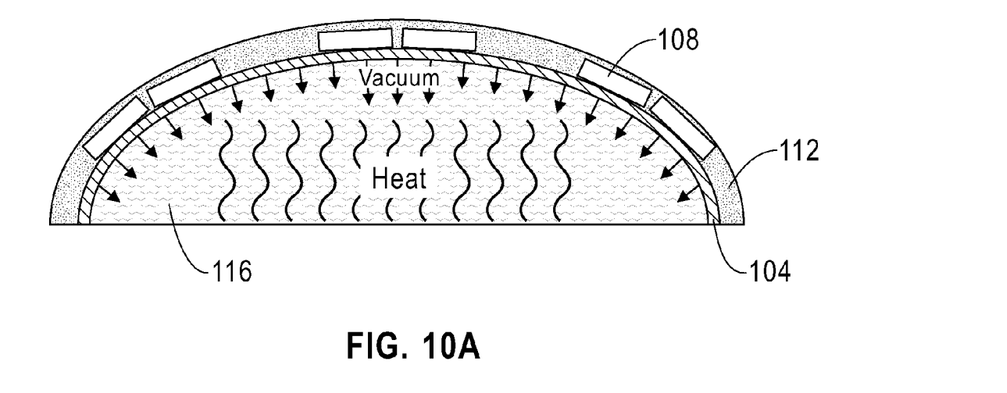
FIG. 10A depicts a process of molding and curing a detached structure, in accordance with an embodiment of the present invention.

FIG. 10A depicts one molding process, in accordance with an embodiment of the present invention. In FIG. 10A, the integrated circuit device(s) depicted in FIG. 6, or other similar integrated circuit device(s) (e.g., integrated circuit device(s) depicted in FIG. 7 and FIG. 9), are fit or otherwise placed upon a mold, such as mold 116. Mold 116 is shaped such that the integrated circuit device(s) are bent or curved to a desired curvature corresponding to the requirements of the final rigid integrated circuit device(s) structure. A variety of curvatures are envisioned by embodiments of the present invention (see FIG. 10C), provided that the curvature coincides with the desired use or application for the integrated circuit device. Mold 116, or another similar mold, has a curvature pattern corresponding to the desired curve of each integrated circuit device. In the depicted embodiment, mold 116 utilizes vacuum assistance to hold the integrated circuit device(s) in place upon the mold. In other embodiments, a variety of other techniques may be employed to hold the integrated circuit device(s) in place upon the mold. For an example, refer to an additional embodiment discussed in reference to FIG. 10B.

Figure 11:
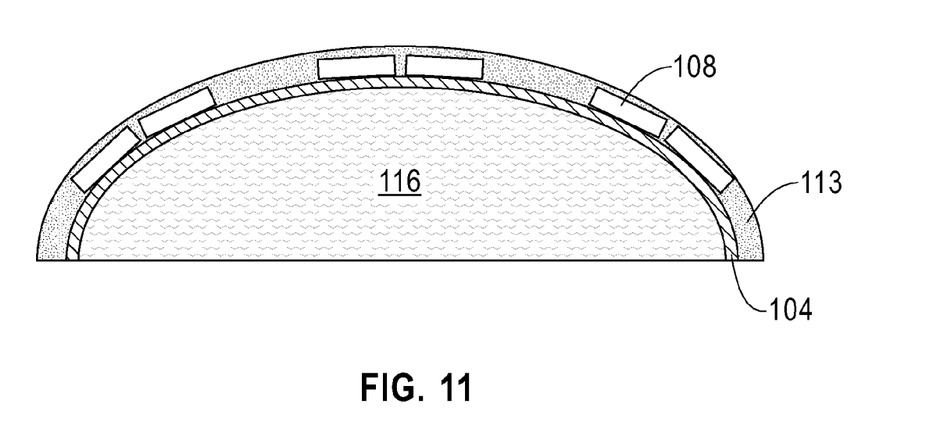
FIG. 11 depicts a detached structure subsequent to a molding and curing process, in accordance with an embodiment of the present invention.

Upon placing the integrated circuit device(s) upon mold 116, the integrated circuit device(s) may be heated such that B-staged mold material 112 (or alternatively, molding film 114), is cured (see FIG. 11). In some embodiments, B-staged mold material 112 is cured to a desired, or optimal cure state for the specific application. In other embodiments, B-staged mold material 112 continues to be cured until B-staged mold material 112 is fully cured. In the depicted embodiment, mold 116 may provide heat to cure the resin and amine composition that comprises mold material 112 (or alternatively, molding film 114). In other embodiments, the environment surrounding mold 116 and the integrated circuit device(s) may be heated to cure B-staged mold material 112 (or alternatively molding film 114). In embodiments of the present invention, heat may be applied via additional methods generally known in the art. The amount of heat necessary to cure the resin and amine composition of B-staged mold material 112 (or alternatively molding film 114) depends upon the particular composition of the resin and amine composition, as discussed with regard to FIG. 4.

Figure 10B:
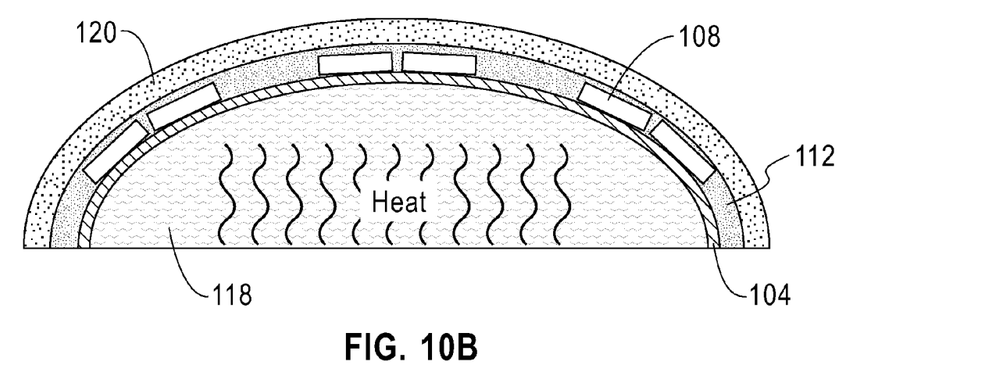
FIG. 10B depicts a process of molding and curing a detached structure, in accordance with an embodiment of the present invention.

FIG. 10B depicts an additional molding process, in accordance with an embodiment of the present invention. In FIG. 10B, a compression molding process is used. In FIG. 10B, the integrated circuit device(s) are formed in an area located between lower mold 118 and upper mold 120 and subsequently heated, in order to cure the resin and amine composition of B-staged mold material 112. In some embodiments, heat is provided through lower mold 118. In other embodiments, upper mold 120 generates heat. In still other embodiments, both lower mold 118 and upper mold 120 generate heat. In further embodiments, the environment surrounding lower mold 118, the integrated circuit device(s), and upper mold 120 is heated.

Figure 10C:
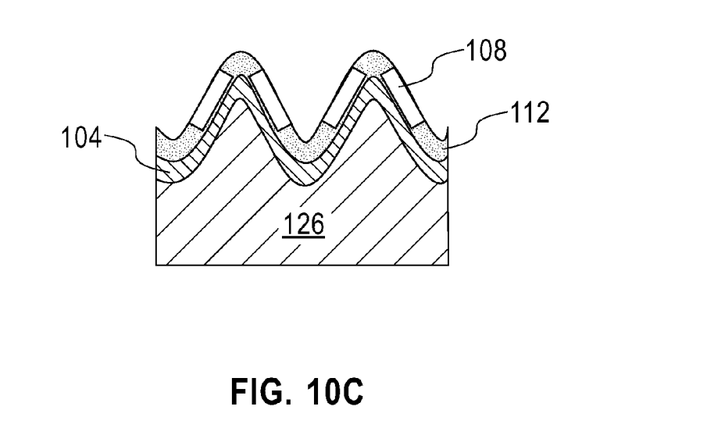
FIG. 10C depicts an example of an alternative mold shape, in accordance with an embodiment of the present invention.

FIG. 10C depicts an additional type of mold, in accordance with an embodiment of the present invention. As discussed with regard to FIG. 10A, a variety of mold shapes and patterns, with varying levels of curvature may be used, based upon the desired curvature of the integrated circuit device. In some embodiments, non-uniform or non-symmetric curvature may be used, if such curvature is desired for the resulting integrated circuit device.

FIG. 11 depicts integrated circuit device(s) upon mold 116 subsequent to the curing process. B-staged molding material 112 (or alternatively molding film 114) has been cured (e.g., fully cured, cured to a desired state for the specific application, etc.) and is now cured material 113 (or alternatively a cured film, not shown). Cured material 113 (or alternatively cured film) serves to provide support to each integrated circuit device. Depending upon the epoxy and amine composition of cured material 113 (or alternatively cured film), cured material 113 (or alternatively cured film) will have varying levels of rigidity and flexibility. Typically, cured material 113 will have greater rigidly than the integrated circuit device without cured material 113. In general, cured material 113 (or alternatively cured film) will create a more rigid structure for each integrated circuit device, than in a similar device without cured material 113 (or alternatively cured film). Such structure may enhance the ease and ability to handle the integrated circuit device and bond the integrated circuit device to the desired curved surface.

Figure 12:
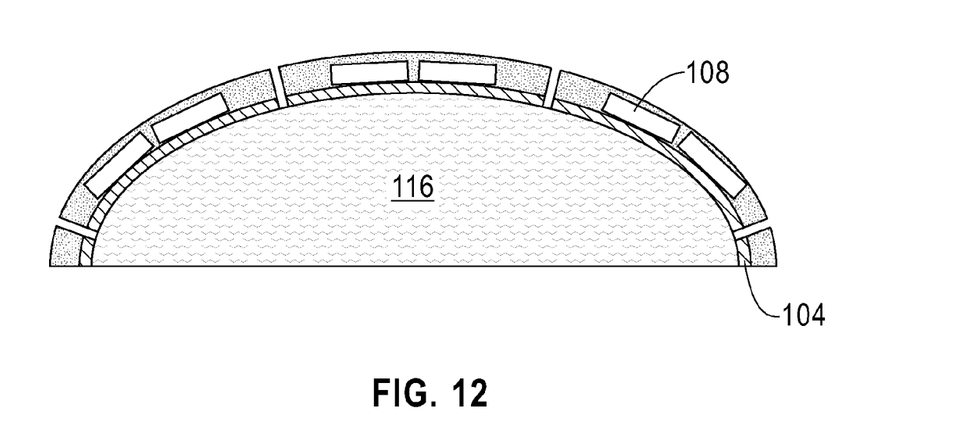
FIG. 12 depicts a process of singulating each integrated circuit device from the detached structure, in accordance with an embodiment of the present invention.

FIG. 12 depicts a singulated integrated circuit devices upon mold 116. In some embodiments, there may be more than one integrated circuit device or package on the molded set of integrated circuit device(s). In FIG. 12, each integrated circuit device or package is singulated. Singulation is the process of reducing a wafer or other package containing multiple identical integrated circuits to individual dies, each containing one of those circuits. In some embodiments, a laser is used to singulate each integrated circuit device or package from the structure of multiple devices. In other embodiments, singulation is accomplished using a water-cooled circular saw with diamond-tipped teeth. In the depicted embodiment, singulation occurs while the integrated circuit device(s) are located on mold 116. In still other embodiments, another known singulation technique may be used. In other embodiments, the integrated circuit devices may be removed from mold 116 prior to singulation.

The resulting structure is generally a curved integrated circuit. Based on the properties of the epoxy resin and amine composition, the structure may have varying degrees of flexibility or rigidity.

Figure 13:
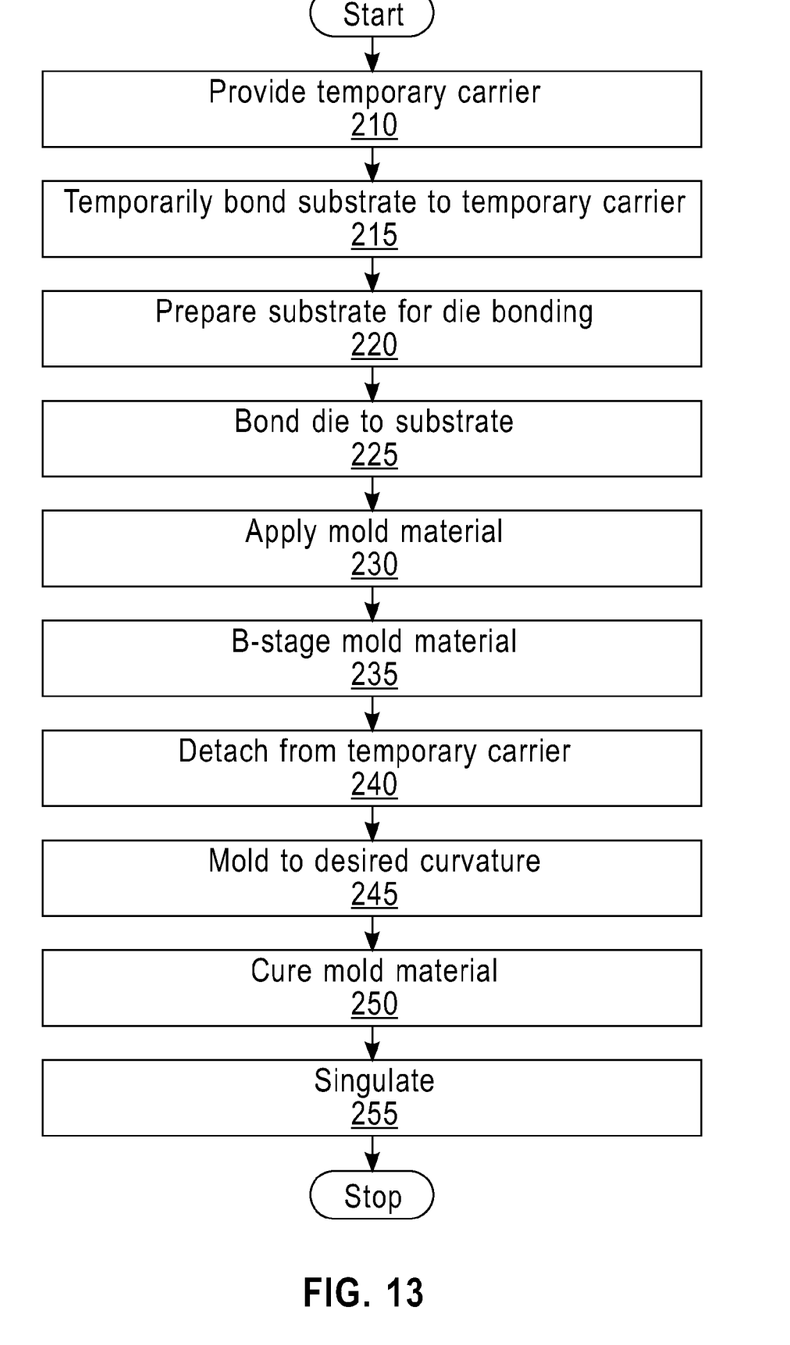
FIG. 13 illustrates a flowchart of a process for the construction of an integrated circuit device, in accordance with an embodiment of the present invention.

FIG. 13 illustrates a flowchart of a process for the construction of an integrated circuit device, in accordance with an embodiment of the invention.

In step 210, a temporary carrier, such as temporary carrier 102 (see FIG. 1) is provided. In step 215, a substrate, such as substrate 104 (see FIG. 1), is temporarily bonded to the temporary carrier. In one embodiment, the substrate is temporarily bonded to the temporary carrier via a temporary adhesive. In step 220, the substrate is prepared for die bonding. For example, solder bumps, metal foil, and/or bondwires may be affixed to substrate 104 to be used as the conductive element. In step 225, each die, as applicable, is bonded to the substrate in accordance with the requirements of the resulting integrated circuit device.

In step 230, mold material, such as mold material 112 or molding film 114, is applied. In step 235, if necessary, the mold material is B-staged via the application of UV light or heat to the mold material. In step 240, the integrated circuit device(s) are detached from the temporary carrier. The integrated circuit device(s) may be detached from the temporary carrier via, for example, a laser or UV light.

In step 245, the integrated circuit device(s) are placed in a mold corresponding to the desired curvature for the resulting integrated circuit device(s). In one embodiment, the integrated circuit device(s) are held in place upon the mold through the use of a vacuum. In another embodiment, the integrated circuit device(s) are held in place upon the mold through the use of an upper and a lower mold. In step 250, the mold material is cured, such that it creates a more rigid structure, based upon the epoxy and amine composition. In some embodiments, the mold material us cured through additional heat applied via the mold or to the surrounding environment of the integrated circuit device(s). In step 255, as necessary, each integrated circuit device is singulated from the integrated circuit device(s) via, for example, a laser or water-cooled circular saw with diamond-tipped teeth.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Having described embodiments of a wafer level overmold for three dimensional surfaces and a process of manufacturing a wafer level overmold for three dimensional surfaces (which are intended to be illustrative and not limiting), it is noted that modifications and variations may be made by persons skilled in the art in light of the above teachings. It is therefore to be understood that changes may be made in the particular embodiments disclosed which are within the scope of the invention as outlined by the appended claims.

What is claimed is:

1. A method for shaping a flexible integrated circuit to a curvature, the method comprising:
   providing a flexible integrated circuit, wherein the flexible integrated circuit includes a flexible substrate that is substantially straight;
   depositing an epoxy resin and amine composition on the flexible integrated circuit, wherein the epoxy resin and amine composition is liquid;
   B-staging the deposited epoxy resin and amine composition;
   placing the flexible integrated circuit on a mold, such that, at least, the flexible substrate is bent to a curvature; and
   curing the B-staged epoxy resin and amine composition subsequent to placing the flexible integrated circuit on the mold.

2. The method of claim 1, further comprising:
   affixing the provided flexible integrated circuit to a rigid carrier prior to the step of depositing the epoxy resin and amine composition on the flexible integrated circuit; and
   detaching the flexible integrated circuit from the rigid carrier subsequent to B-staging the deposited epoxy resin and amine composition.

3. The method of claim 1, wherein curing the B-staged epoxy resin and amine composition comprises heating the B-staged epoxy resin and amine composition.

4. The method of claim 1, where placing the flexible integrated circuit on the mold further comprises:
   holding the flexible integrated circuit in place on the mold with a vacuum.

5. The method of claim 4, wherein the mold is beneath the flexible integrated circuit.

6. The method of claim 1, wherein placing the flexible integrated circuit on the mold comprises:
   placing the flexible integrated circuit in an area between a first mold portion of the mold and a second mold portion of the mold, wherein the area formed between the first mold portion and the second mold portion corresponds to the curvature.

7. The method of claim 1, wherein the provided flexible integrated circuit comprises a plurality of integrated circuits on the flexible substrate, further comprising:
   singulating each of the plurality of integrated circuits.

8. The method of claim 1, wherein the step of curing the B-staged epoxy resin and amine composition continues until the B-staged epoxy resin and amine composition is cured fully.

9. The method of claim 1, wherein the flexible integrated circuit is a System-on-Package.

10. The method of claim 1, wherein providing the flexible integrated circuit comprises:
    providing a flexible substrate that is substantially straight; and
    bonding a die to the flexible substrate.

11. A method for shaping a flexible integrated circuit to a curvature, the method comprising:
    providing a flexible integrated circuit, wherein the flexible integrated circuit includes a flexible substrate that is substantially straight;
    applying a B-staged epoxy resin and amine composition film on the flexible integrated circuit;
    placing the flexible integrated circuit on a mold, such that, at least, the flexible substrate is bent to a curvature; and
    curing the B-staged epoxy resin and amine composition film subsequent to placing the flexible integrated circuit on the mold.

12. The method of claim 11, further comprising:
    affixing the provided flexible integrated circuit to a rigid carrier prior to the step of applying the B-staged epoxy resin and amine composition film; and
    detaching the flexible integrated circuit from the rigid carrier subsequent to B-staging the deposited epoxy resin and amine composition.

13. The method of claim 11, wherein curing the B-staged epoxy resin and amine composition film comprises heating the B-staged epoxy resin and amine composition film.

14. The method of claim 11, where placing the flexible integrated circuit on the mold further comprises:
    holding the flexible integrated circuit in place on the mold with a vacuum.

15. The method of claim 11, wherein placing the flexible integrated circuit on the mold comprises:
    placing the flexible integrated circuit in an area between a first mold portion of the mold and a second mold portion of the mold, wherein the area formed between the first mold portion and the second mold portion corresponds to the curvature.

16. The method of claim 11, wherein the provided flexible integrated circuit comprises a plurality of integrated circuits on a substrate, further comprising:
    singulating each of the plurality of integrated circuits.

17. The method of claim 11, wherein the step of curing the B-staged epoxy resin and amine composition film continues until the B-staged epoxy resin and amine composition film is cured fully.

18. The method of claim 11, wherein the flexible integrated circuit is a System-on-Package.

* * * * *